United States Patent [19]
Okamura et al.

[11] Patent Number: 6,033,930
[45] Date of Patent: Mar. 7, 2000

[54] LEAD FRAME CARRYING METHOD AND LEAD FRAME CARRYING APPARATUS

[75] Inventors: Noboru Okamura; Kaname Nagamine; Katsunori Hirata; Kazuo Hirai; Keisaku Oono; Akira Miyazaki, all of Niigata, Japan

[73] Assignee: Matsushita Electronics Corporation, Osaka, Japan

[21] Appl. No.: 08/896,336

[22] Filed: Jul. 17, 1997

[30] Foreign Application Priority Data

Jul. 23, 1996  [JP]  Japan ................................. 8-193203

[51] Int. Cl.⁷ ........................... H01L 21/44; H01L 21/48; H01L 21/50
[52] U.S. Cl. ..................... 438/106; 438/111; 438/121; 438/123
[58] Field of Search ................... 438/106, 111, 438/121, 123

[56] References Cited

U.S. PATENT DOCUMENTS

| | | | |
|---|---|---|---|
| 4,188,438 | 2/1980 | Burns | 438/106 |
| 5,270,260 | 12/1993 | Scheuenpflug | 438/118 |
| 5,300,175 | 4/1994 | Gardner et al. | 438/118 |
| 5,473,814 | 12/1995 | White | 438/108 |
| 5,661,086 | 8/1997 | Nakashima | 438/118 |
| 5,661,090 | 8/1997 | Otani | 438/118 |

FOREIGN PATENT DOCUMENTS 05283443  10/1993  Japan.

Primary Examiner—Kevin M. Picardat
Assistant Examiner—D. Mark Collins
Attorney, Agent, or Firm—McDermott, Will & Emery

[57] ABSTRACT

In a lead frame carrying method and apparatus, first and second press units are provided on sides of a pair of carrier rails. When carrying a lead frame along the carrier rails, a side edge portion of the lead frame is clamped by being pressed from a surface and a back face of the lead frame almost perpendicularly thereto by the first and second press units. In the lead frame, the clamped side edge portion is floated by a predetermined height above one of the carrier rails during carrying. Accordingly, the lead frame can surely be clamped and carried. In addition, when carrying the lead frame along the carrier rails, the lead frame is damaged with difficulty by the carrier rails.

4 Claims, 6 Drawing Sheets

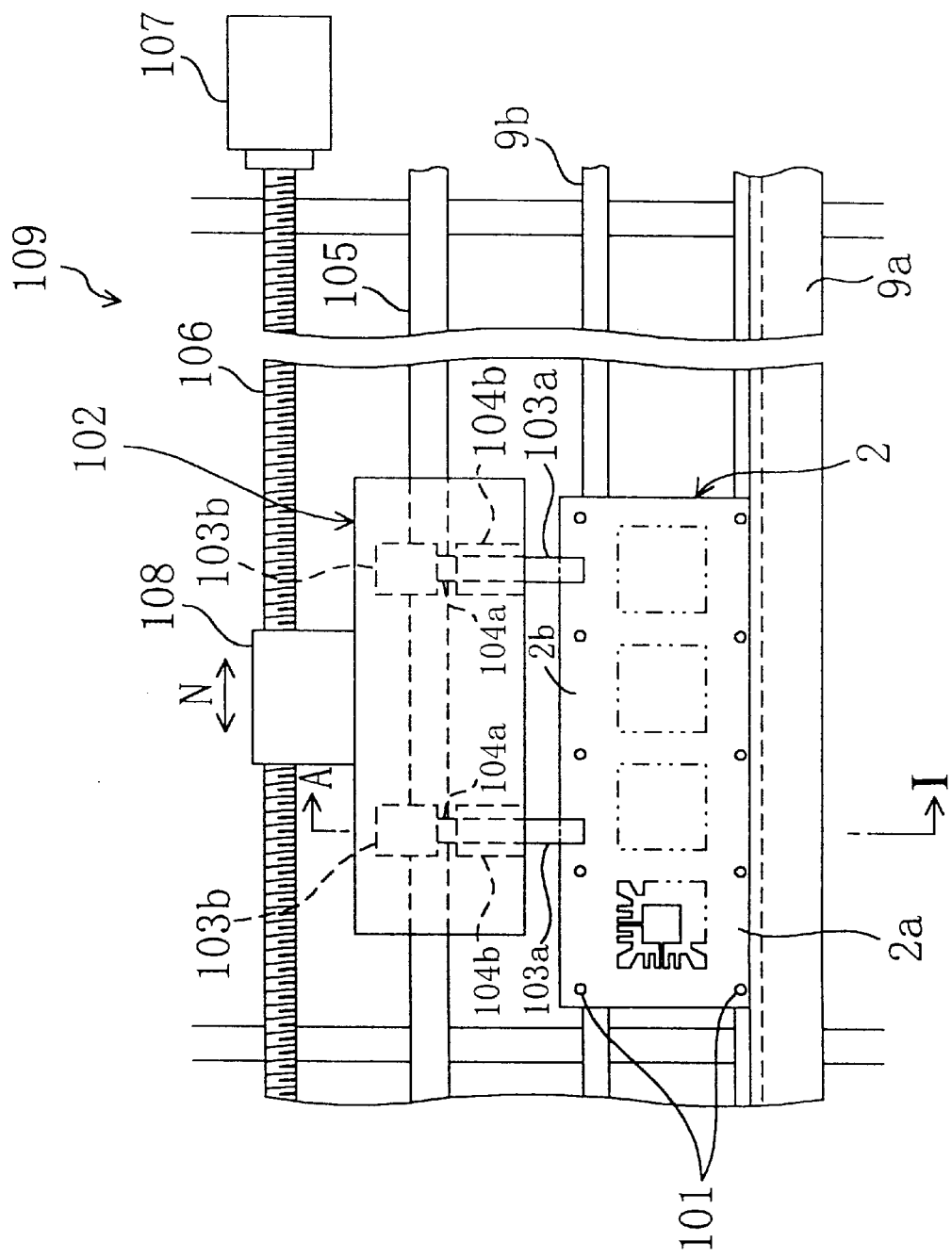

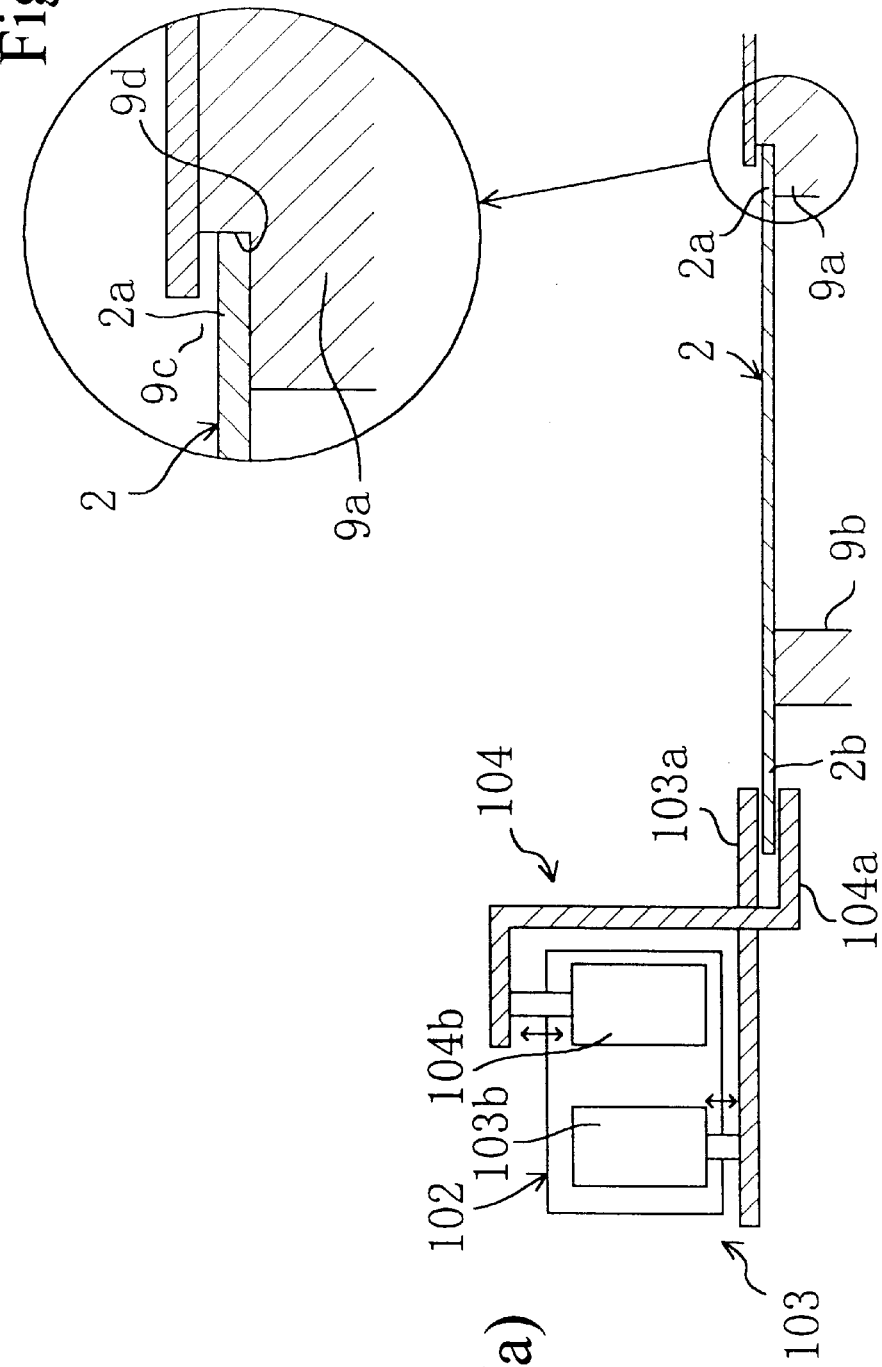

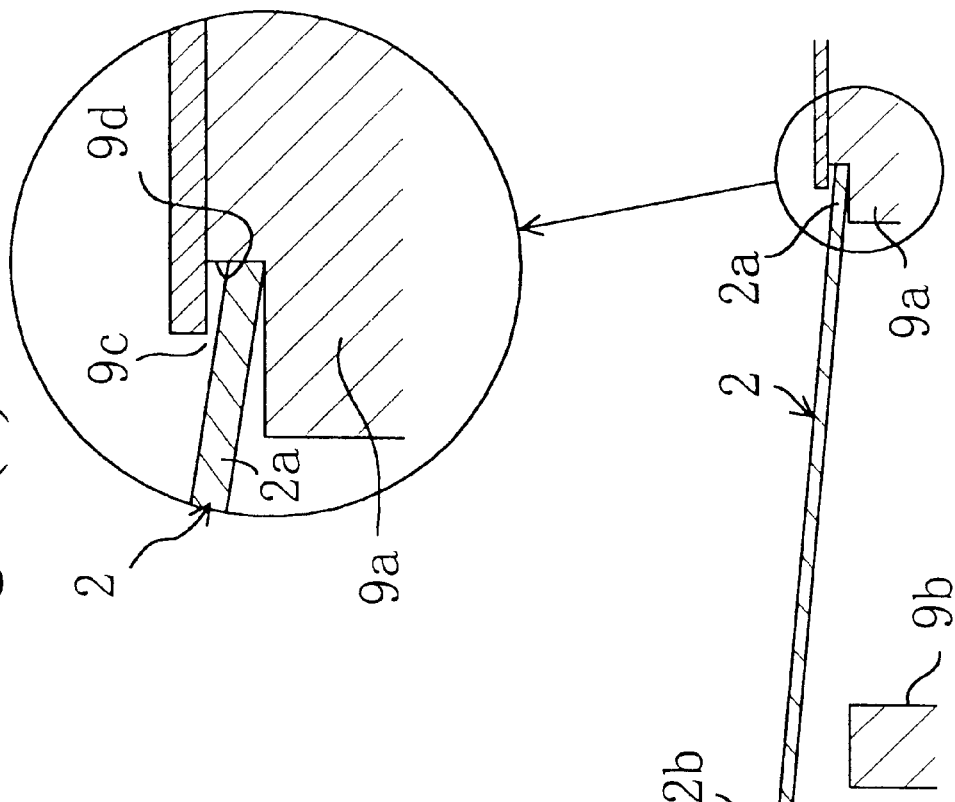
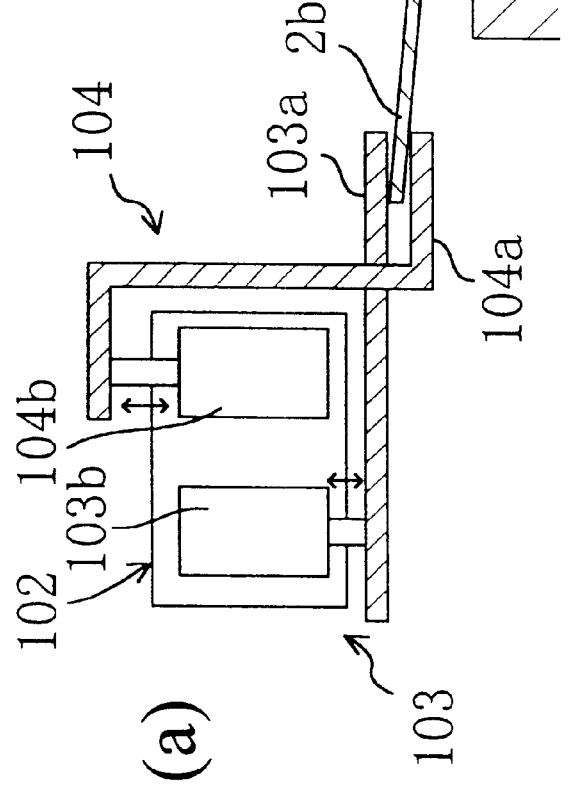

LEAD FRAME CARRYING METHOD AND LEAD FRAME CARRYING APPARATUS

BACKGROUND OF THE INVENTION

The present invention relates to improvement of a lead frame carrying method and a lead frame carrying apparatus.

A die bonding step of mounting a die to a lead frame is performed by applying a bond to a predetermined portion of the lead frame positioned on a pair of carrier rails and mounting the die on the bond. As a preprocessing step, the lead frame mounted on a magazine is moved and mounted onto the carrier rails. The lead frame mounted on the carrier rails is carried to a dispenser side.

The lead frame which has completed die bonding is carried to a next step along the carrier rails.

A unit (mechanism) for holding the lead frame during carrying will be described below with reference to the drawings.

FIG. 4 is a view showing an appearance of the lead frame, and FIG. 5 is a sectional view showing a structure of lead frame holding means in a lead frame carrying apparatus according to the prior art.

In FIG. 5, a unit 1 serves to clamp a side edge portion 2a of a lead frame 2. As shown in FIG. 4, the lead frame 2 has a plurality of pin holes 101 provided in a line on right and left side edge portions. In FIG. 4, the number of the pin holes 101 is five. A pin (not shown) is inserted into the pin holes 101 to determine right and left positions of the lead frame 2 at a step after the die bonding step.

The reference numeral 3 denotes a solenoid supported on a unit box 4, and the reference numeral 5 denotes a plunger of the solenoid 3. A tip portion of the plunger 5 comes in contact with an upper left portion of a swing lever 6. The swing lever 6 is supported clockwise (in a direction of an arrow θ1) or counterclockwise (a direction of an arrow θ2) on the unit box 4 by a pivot section 7 so as to freely swing.

The reference numeral 8 denotes a receiving plate attached to the unit box 4 such that an upper face thereof is on a level with an upper face 9e of a carrier rail 9b, the reference numeral 10 denotes a spring having a lower end attached to the receiving plate 8 and an upper end attached to a lower left portion of the swing lever 6, and serves to energize the lower left portion upward. A lower right portion of the swing lever 6 is hooked downward.

When the solenoid 3 is caused to operate in such a direction as to pull the plunger 5, a tip portion 6a of the swing lever 6 is rotated clockwise (in the θ1 direction) by force of the spring 10. A side edge portion of the lead frame 2 is pressed downward by the tip portion 6a. Consequently, the side edge portion 2a of the lead frame 2 is clamped between the tip portion 6a of the swing lever 6 and the receiving plate 8.

When the operation of the solenoid 3 is released, the plunger 5 is extended to its original length against the force of the spring 10 so that the swing lever 6 swings counterclockwise (in the θ2 direction). Consequently, the clamping state of the side edge portion 2a of the lead frame 2 is released.

In recent years, nickel (Ni) and palladium (Pd) or Ni, Pd and gold (Au) are laminated and plated over a whole periphery of a copper (Cu) lead frame as shown in FIGS. 6 (a) and 6 (b).

Such a lead frame has a surface which is much smoother than that of a Fe lead frame (a so-called "42 alloy") according to the prior art. During carrying, the lead frame cannot surely be clamped. For this reason, yield is deteriorated at the die bonding step.

In the case where the lead frame has a top layer plated with a gold layer, the gold layer on a back face of the lead frame is easily damaged by coming in contact with a pair of carrier rails in the process of carrying the lead frame along the carrier rails because the gold layer is soft. Therefore, a finished product is affected. Furthermore, the gold layer on the back face of the lead frame is scraped due to contact with the carrier rails so that fine "refuse" is generated. This refuse sometimes blocks the pin hole 101. When the pin hole 101 is blocked, the lead frame cannot be positioned well at a step after the die bonding step. Therefore, it is also necessary to stop the apparatus in order to ensure normal operation. Consequently, an operation rate of the apparatus is reduced.

SUMMARY OF THE INVENTION

It is an object of the present invention to provide a carrying method and apparatus for surely clamping and carrying a lead frame having a smooth surface, and a carrying method and apparatus in which the lead frame is damaged with difficulty.

In order to achieve the above-mentioned object, the lead frame carrying method and apparatus according to the present invention serve to clamp one of side edge portions of the lead frame from both sides.

The lead frame carrying method and apparatus according to another invention serve to float one of side edge portions of the lead frame above carrier rails when carrying the lead frame along the carrier rails.

More specifically, the present invention provides a lead frame carrying method for carrying a lead frame having a top layer plated with a palladium layer or a gold layer, comprising the steps of clamping by pressing a side edge portion of the lead frame from a surface and a back face of the lead frame almost perpendicularly thereto, and carrying the clamped lead frame toward a target position.

The present invention provides a lead frame carrying method for carrying a lead frame having a top layer plated with a palladium layer or a gold layer along a pair of carrier rails, comprising the steps of mounting one of right and left side edge portions of the lead frame on one of the carrier rails, floating the other side edge portion of the lead frame by an optional height above the other carrier rail, clamping the other side edge portion of the lead frame, and carrying the clamped lead frame toward a target position.

Furthermore, the present invention provides a lead frame carrying apparatus comprising a pair of carrier rails capable of mounting a lead frame having a top layer plated with a palladium layer or a gold layer, a press unit for clamping by pressing a side edge portion of the lead frame from a surface and a back face of the lead frame almost perpendicularly thereto, and moving means for moving the press unit toward a target position along the carrier rails.

In addition, the present invention provides a lead frame carrying apparatus comprising a pair of carrier rails capable of mounting a lead frame having a top layer plated with a palladium layer or a gold layer, a press unit for floating and clamping one of right and left side edge portions of the lead frame by an optional height above one of the carrier rails in a state where the other side edge portion of the lead frame is mounted on the other carrier rail, and moving means for moving the press unit toward a target position along the carrier rails.

With the above-mentioned structure, one of the side edge portions of the lead frame is clamped by being pressed vertically from both sides. Therefore, clamping can be performed more surely than in the prior art. Accordingly, even if the surface of the lead frame is plated with the palladium layer or the gold layer and is smooth, the lead frame can be carried well toward a target position.

According to the present invention, one of the side edge portions of the lead frame is mounted on one of the carrier rails, while the other side edge portion of the lead frame is floated by a predetermined height above the other carrier rail and is carried. Therefore, the other side edge portion does not come in contact with the carrier rail provided therebelow. Accordingly, a back face of the other side edge portion is not damaged during carrying. Furthermore, since the other side edge portion is floated, the whole lead frame is correspondingly leaned by a predetermined angle to a horizontal plane and is carried. Consequently, even if one of the side edge portions of the lead frame is mounted on one of the carrier rails, a contact area of the same side edge portion with the carrier rail is reduced more than in the prior art. As a result, a back face of the mounted side edge portion is damaged with difficulty as compared with the prior art. Even if fine refuse is generated due to contact, a quantity of the refuse is small. In addition, the fine refuse rarely enters the pinhole positioned obliquely above. Therefore, the pin hole is seldom blocked.

BRIEF DESCRIPTION OF THE DRAWINGS

The accompanying drawings illustrate preferred embodiments of the present invention, in which:

FIG. 1 is a plan view showing a lead frame carrying apparatus according to a first embodiment of the present invention;

FIG. 2(a) is a section view taken along the line A—A shown in FIG. 1;

FIG. 2(b) is an enlarged view of the right side edge portion of the lead frame when mounted on one of the carrier rails.

FIG. 3(a) is a view showing a state of carrying a lead frame by a lead frame carrying apparatus according to a second embodiment of the present invention;

FIG. 3(b) is an enlarged view of the left side edge portion of the lead frame floated above the upper face of the left carrier rail and clamped.

FIG. 6 (b) is a sectional view typically showing a structure of a lead frame having a top layer plated with a gold layer.

DETAILED DESCRIPTION OF THE INVENTION

Each preferred embodiment of the present invention will be described below with reference to the drawings.
(First Embodiment)

FIG. 1 is a plan view showing a lead frame carrying apparatus according to a first embodiment of the present invention, and FIG. 2 is a sectional view taken along the line 1—1 shown in FIG. 1. In FIG. 2(a), the same components having the same structures as those in the prior art have the same designations and signs.

Figure 4:
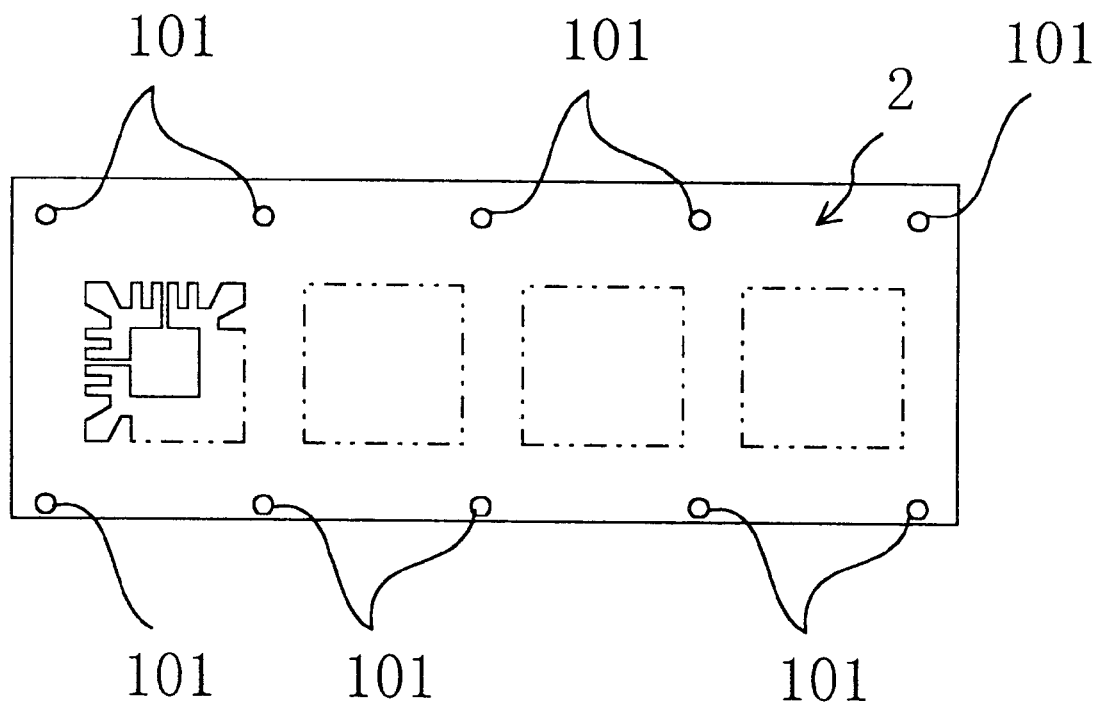
FIG. 4 is a view showing an appearance of the lead frame.
Figure 5:
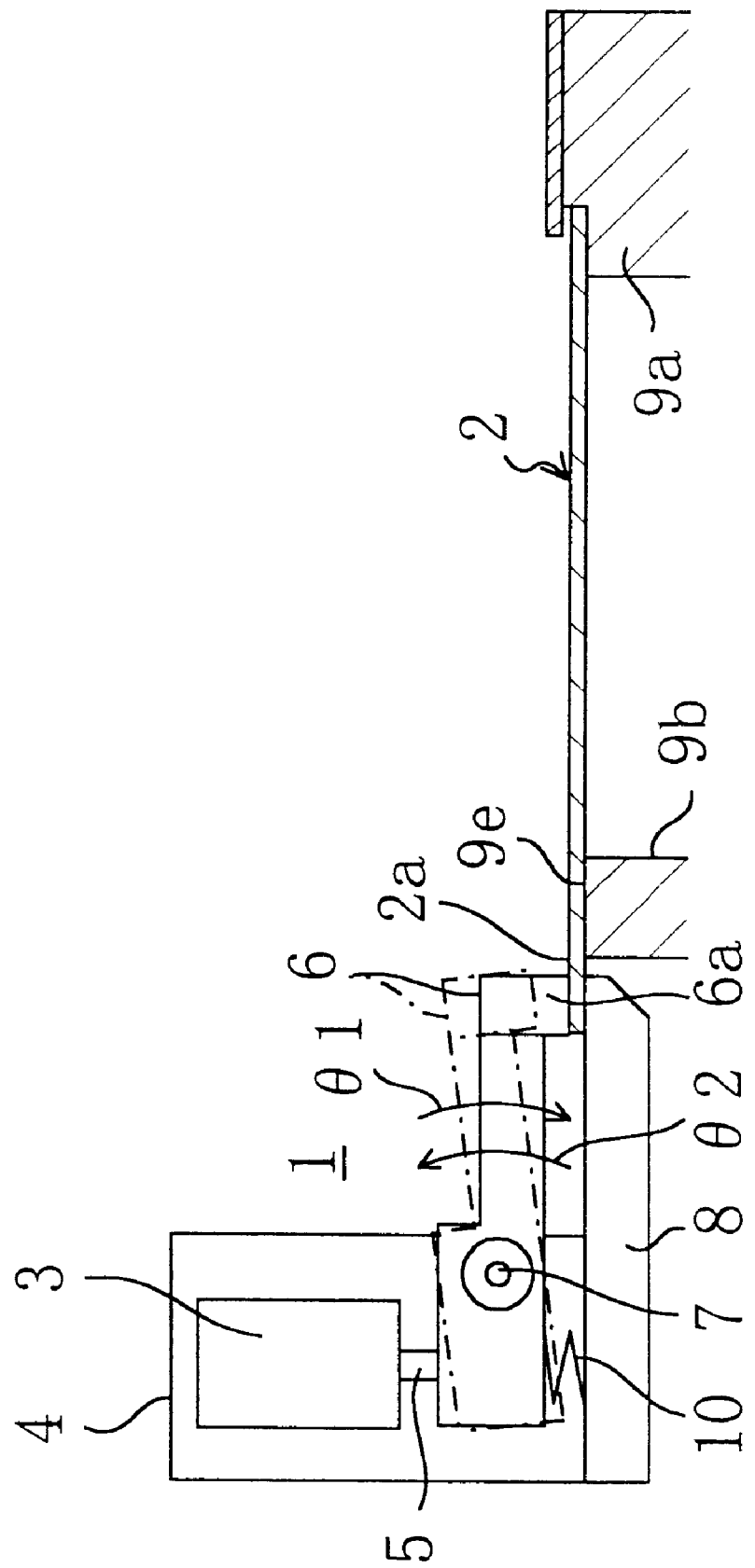
FIG. 5 is a sectional view showing a structure of a lead frame holding device in the lead frame carrying apparatus according to the prior art.
Figure 6A:
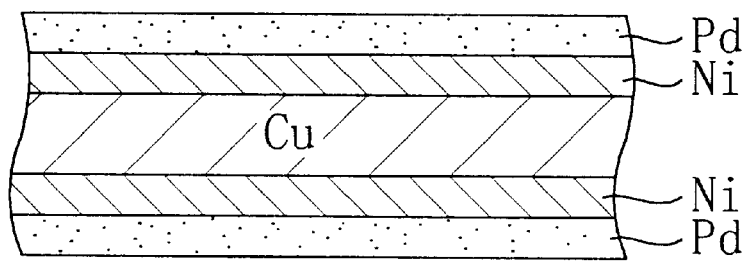
FIG. 6 (a) is a sectional view typically showing a structure of a lead frame having a top layer plated with a palladium layer.
Figure 6B:
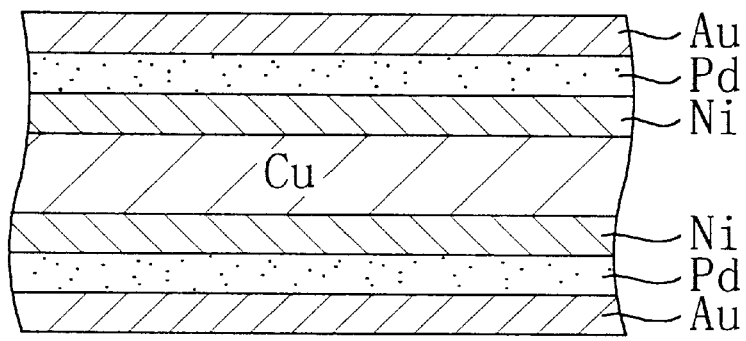

In FIG. 2(a), the reference numeral 2 denotes a lead frame having a top layer plated with a palladium (Pd) layer or a gold (Au) layer as shown in FIG. 6 (a) or 6 (b). A thickness of the lead frame 2 is 0.2 to 0.3 mm, for example. A plurality of pin holes 101 are provided in a line along each of side edge portions 2a and 2b on right and left sides of the lead frame 2.

The reference numerals 9a and 9b denote a pair of carrier rails. The right side edge portion 2a of the lead frame 2 shown in FIG. 2(a) is mounted on one of the carrier rails 9a. An inner portion of the left side edge portion 2b of the lead frame 2 shown in FIG. 2(a) is mounted on the other carrier rail 9b. A step section 9c is provided on the carrier rail 9a. In the step section 9c, an end face of the right side edge portion 2a of the lead frame 2 comes in contact with a longitudinal wall 9d to determine right and left positions of the lead frame 2 as enlarged in detail in FIG. 2.

The reference numeral 102 denotes a moving box for moving the lead frame 2 along the carrier rails 9a and 9b. A first press unit 103 and a second press unit 104 are integrally provided in the moving box 102. The first press unit 103 includes an upper press member 103a having a front end provided above the left side edge portion 2b of the lead frame 2, and a first air cylinder 103b acting as a driving source for vertically moving a rear end of the press member 103a. Similarly, the second press unit 104 also includes a lower press member 104a having a tip portion provided below the left side edge portion 2b of the lead frame 2, and a second air cylinder 104b for vertically moving a rear end of the press member 104a.

Accordingly, the upper press member 103a is moved downward and the lower press member 104a is moved upward by the first and second air cylinders 103b and 104b. Consequently, the left side edge portion 2b of the lead frame 2 is clamped by being pressed from a surface and a back face almost perpendicularly thereto by using the press members.

Furthermore, the reference numeral 105 denotes a guide rail slidably engaged with a lower portion of the moving box 102 for guiding the moving box 102 in parallel with the carrier rails 9a and 9b (in a direction of an arrow "N"), the reference numeral 106 denotes a feed screw provided behind the guide rail 105 in the direction of the arrow "N", the reference numeral 107 denotes a motor for driving the feed screw 106, and the reference numeral 108 denotes a feed nut threaded into the feed screw 106. The feed nut 108 is coupled to the moving box 102.

Accordingly, when the motor 107 is driven, the moving box 102 can be moved in the direction of the arrow "N" while sliding in contact with the guide rail 105. Thus, the moving box 102 can be moved along the carrier rails 9a and 9b with the side edge portion 2b of the lead frame 2 clamped by using the first and second press units 103 and 104.

The moving box 102, the feed screw 106, the feed nut 108, the motor 107 and the guide rail 105 form moving means 109.

The moving box 102 is provided such that it can slightly be moved in a direction orthogonal to a direction in which the carrier rails 9a and 9b extend, and is driven by a drive unit (not shown) and is moved in the orthogonal direction so that the end face of the right side edge portion 2a of the lead frame 2 comes in contact with the longitudinal wall 9d of the step section 9c of the carrier rail 9a.

Operation of the lead frame carrying apparatus according to the present embodiment will be described below.

First of all, operation of the first and second air cylinders 103b and 104b is canceled, and the upper and lower press members 103a and 104a are released.

When the lead frame 2 is mounted (fed) onto the carrier rails 9a and 9b, the first and second air cylinders 103b and 104b are caused to operate so that the upper and lower press members 103a and 104a clamp the left side edge portion 2b of the lead frame 2 from both sides. Then, the moving box 102 is moved in the direction orthogonal to the carrier rails 9a and 9b by the drive unit (not shown), and the end face of the right side edge portion 2a of the lead frame 2 is caused to come in contact with the longitudinal wall 9d of the step section 9c of the carrier rail 9a to position the lead frame 2 transversely. In this state, the motor 107 is driven. As a result, the moving box 102 is guided and moved by the guide rail 105 in the direction of the arrow "N". Consequently, the first and second press units 103 and 104 clamping the lead frame 2 are moved toward a target position integrally with the moving box 102.

In the target position, die bonding is performed. In the same manner as the foregoing, the lead frame 2 is carried to a next step.

Since the side edge portion 2b of the lead frame 2 is clamped by being pressed almost vertically from the surface and the back face by using the first and second press units 103 and 104, clamping force is increased. Accordingly, even if the plated surface of the lead frame 2 is smoother than the palladium or gold layer acting as the top layer, the side edge portion 2b of the lead frame 2 can be clamped more surely than in the prior art and the lead frame 2 can be carried well to the target position.

The lead frame 2 can be clamped irrespective of the pin hole 101 formed on the lead frame 2 and a pin (not shown) engaged with the pin hole 101. Therefore, also in the case where the kind of the lead frame 2 is changed so that arrangement of the pin hole 101 is varied, it is not necessary to change arrangement of the pin engaged with the pin hole 101. Thus, flexible measures can be taken.

Furthermore, the moving box 102 is expanded in the direction (the "N" direction in FIG. 1) where the carrier rails 9a and 9b extend, which is not shown. A plural sets of the first and second press units 103 and 104 are provided at regular intervals. When these sets are caused to operate interlockingly at the same time, the lead frame 2 can be carried more rapidly.

(Second Embodiment)

A second embodiment of the present invention will be described below.

FIG. 3(a) is a view showing a carrying state of a lead frame carrying apparatus according to the second embodiment of the present invention.

In FIG. 3(a), the second embodiment is different from the first embodiment in that a left side edge portion 2b of a lead frame 2 is floated above an upper face of a left carrier rail 9b and is clamped.

A structure of the carrying apparatus has the following difference. More specifically, operation quantities of first and second air cylinders 103b and 104b are preset such that a position of the side edge portion 2b clamped by upper and lower press members 103a and 104a is floated by an optional height above the upper face of the left carrier rail 9b when claming the lead frame 2 during carrying as compared with the first embodiment. The optional height for floating can be set to almost the same value as a thickness of the lead frame 2, for example, 0.2 to 0.3 mm. FIG. 3(a) exaggerates the floated height in order to clarify a feature of the present invention, that is, "float".

According to the present embodiment, the lead frame carrying apparatus performs the following operation, for example.

First of all, operation of the first and second air cylinders 103b and 104b is canceled, and the upper and lower press members 103a and 104a are released.

The lead frame 2 is mounted on a pair of carrier rails 9a and 9b. Then, the second air cylinder 104b is caused to operate so that the lower press member 104a is moved upward and the left side edge portion 2b of the lead frame 2 is floated by an optional height above the upper face of the left carrier rail 9b. Thereafter, the first air cylinder 103b is caused to operate, and the upper press member 103a is moved downward and caused to cooperate with the lower press member 104a to clamp and press the left side edge portion 2b of the lead frame 2 almost vertically from both sides.

Subsequently, the moving box 102 is moved in a direction orthogonal to the carrier rails 9a and 9b by a drive unit (not shown) so that an end face of a right side edge portion 2a of the lead frame 2 is caused to come in contact with a longitudinal wall 9d of a step section 9c of the right carrier rail 9a to position the lead frame 2 transversely.

In that state, a motor 107 is driven. As a result, the moving box 102 is guided and moved by a guide rail 105 in a direction of an arrow "N". Consequently, first and second press units 103 and 104 clamping the side edge portion 2b of the lead frame 2 are moved toward a target position integrally with the moving box 102.

In the target position, die bonding is performed. In the same manner as the foregoing, the lead frame 2 is carried to a next step.

The left side edge portion 2b of the lead frame 2 is floated by an optional height above the upper face of the left carrier rail 9b and is carried. Therefore, a back face of the side edge portion 2b is not damaged by the carrier rail 9b during carrying.

In addition, it is apparent from FIG. 3 that the right side edge portion 2a of the lead frame 2 is leaned with respect to a horizontal plane. Correspondingly, a contact area with the right carrier rail 9a is reduced more than in the prior art. Therefore, a back face of the right side edge portion 2a of the lead frame 2 is also damaged with difficulty.

In the present embodiment, the left side edge portion 2b of the lead frame 2 has been first floated and then clamped. As a matter of course, the left side edge potion 2b may first be clamped by the first and second press units 103 and 104 and a clamp may be held to move the upper and lower press members 103a and 104a upward by using the press units 103 and 104 such that the left side edge portion 2b of the lead frame 2 is floated.

While the first and second air cylinders 103b and 104b have been used to float the left side edge portion 2b of the lead frame 2 above the position of the upper face of the right carrier rail 9b in the present embodiment, a private cylinder to float the side edge portion 2b may be provided separately without using the above-mentioned cylinders.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A lead frame carrying method for carrying a lead frame having a top layer plated with a palladium layer or a gold layer, comprising the steps of:

clamping by pressing a side edge portion of the lead frame from a surface and a back face of the lead frame almost perpendicularly thereto; and carrying the clamped lead frame toward a target position.

2. A lead frame carrying method for carrying a lead frame having a top layer plated with a palladium layer or a gold layer along a pair of carrier rails, comprising the steps of:

mounting one of right and left side edge portions of the lead frame on one of the carrier rails;

floating the other side edge portion of the lead frame by a height above the other carrier rail;

clamping the other side edge portion of the lead frame; and carrying the clamped lead frame toward a target position.

3. A lead frame carrying method for carrying a lead frame having a top layer plated with a palladium layer or a gold layer along a pair of carrier rails, comprising the steps of:

mounting one of right and left side edge portions of the lead frame on one of the carrier rails;

floating the other side edge portion of the lead frame by a height above the other carrier rail;

clamping by pressing the other side edge portion of the lead frame from a surface and a back face of the lead frame almost perpendicularly thereto; and carrying the clamped lead frame toward a target position.

4. A lead frame carrying method for carrying a lead frame having a smooth surface along a pair of carrier rails, comprising the steps of:

mounting one of right and left side edge portions of the lead frame on one of the carrier rails;

floating the other side edge portion of the lead frame by a height above the other carrier rail;

clamping by pressing the other side edge portion of the lead frame from a surface and a back face of the lead frame almost perpendicularly thereto; and carrying the clamped lead frame toward a target position.

* * * * *